United States Patent [19]

Weidenbruch et al.

[11] Patent Number: 4,614,936

[45] Date of Patent: Sep. 30, 1986

[54] METHOD AND ARRANGEMENT FOR INTERPOLATIVE A/D CONVERSION

[75] Inventors: Hans U. Weidenbruch, Wedemark; Hans G. Musmann, Salzgitter-Bad, both of Fed. Rep. of Germany

[73] Assignee: Ant Nachrichtentechnik GmbH, Backnang, Fed. Rep. of Germany

[21] Appl. No.: 591,950

[22] Filed: Mar. 21, 1984

[30] Foreign Application Priority Data

Mar. 22, 1983 [DE] Fed. Rep. of Germany ....... 3310310

[51] Int. Cl.$^4$ ............................................. H03M 1/00
[52] U.S. Cl. .......................... 340/347 AD; 340/347 M
[58] Field of Search .................... 340/347 AD, 347 M

[56] References Cited

U.S. PATENT DOCUMENTS

| 4,187,466 | 2/1980 | Kasson et al. | 340/347 AD |
| 4,353,060 | 10/1982 | Endoh et al. | 340/347 AD |
| 4,384,278 | 5/1983 | Benjamin | 340/347 AD |

OTHER PUBLICATIONS

Bernd Neubig, "Extrem Rauscharmer 96-MHz-Quarzoszillator . . . ", UKW Berichte, No. 2, 2/81, pp. 91-100.

Karl-Dirk Kammeyer, "Analyse Des Quantisierungsfehlers Bei der verteilten Arithmetik", No. 29, 1977, pp. 1-201.

James C. Candy, "A Use of Limit Cycle Oscillations . . ", IEEE Trans. on Communications, Mar. 1974, vol. COM-22, No. 3, pp. 298-305.

James C. Candy et al., "Using Triangularly Weighted Interpolation . . . ", IEEE Transactions on Communications, Nov. 1976, vol. COM 24, No. 11, pp. 1268-1275.

U. Tietze et al., Halbleiter-Schaltungstechnik, 5th Ed., pp. 59-67.

*Primary Examiner*—Bernard Roskoski
*Attorney, Agent, or Firm*—Spencer & Frank

[57] ABSTRACT

Method for the interpolative conversion of an analog input signal to a digital output signal including forming an intermediate signal from the input signal; integrating the intermediate signal; sampling the intergrated intermediate signal at a sampling frequency which is a multiple of the Nyquist frequency to form a sampled signal; quantizing the sampled signal with an amplitude resolution corresponding to one bit to form a quantized signal; forming a feedback signal from the quantized signal, the feedback signal comprising pulses the peak amplitude of which can be one of two representative values and which return to a mean value within an interval equal to one period of the sampling frequency; combining the feedback signal with the input signal to form the intermediate signal; passing the quantized signal through a digital lowpass filter; and sampling the output of the digital lowpass filter to produce a PCM signal, the PCM signal constituting the digital output signal.

7 Claims, 17 Drawing Figures

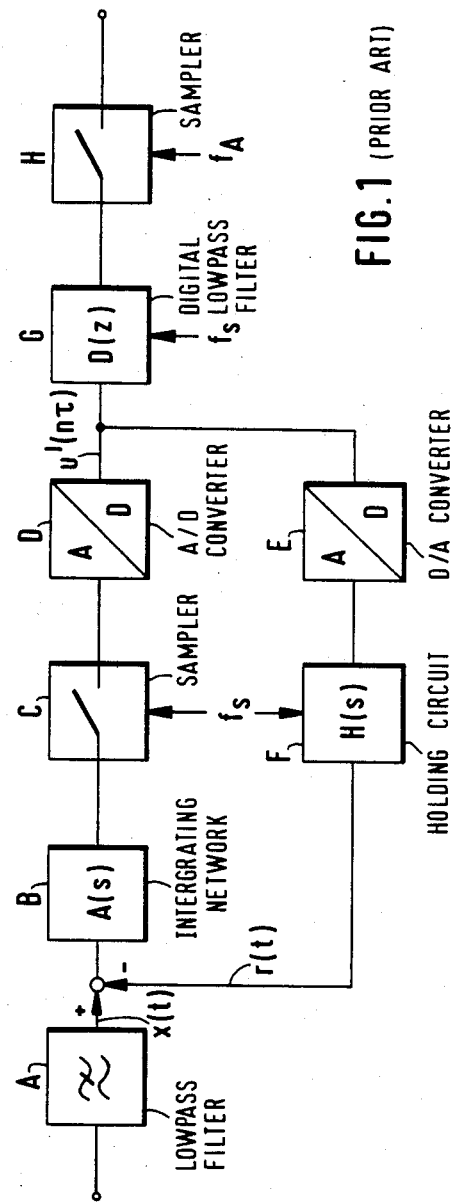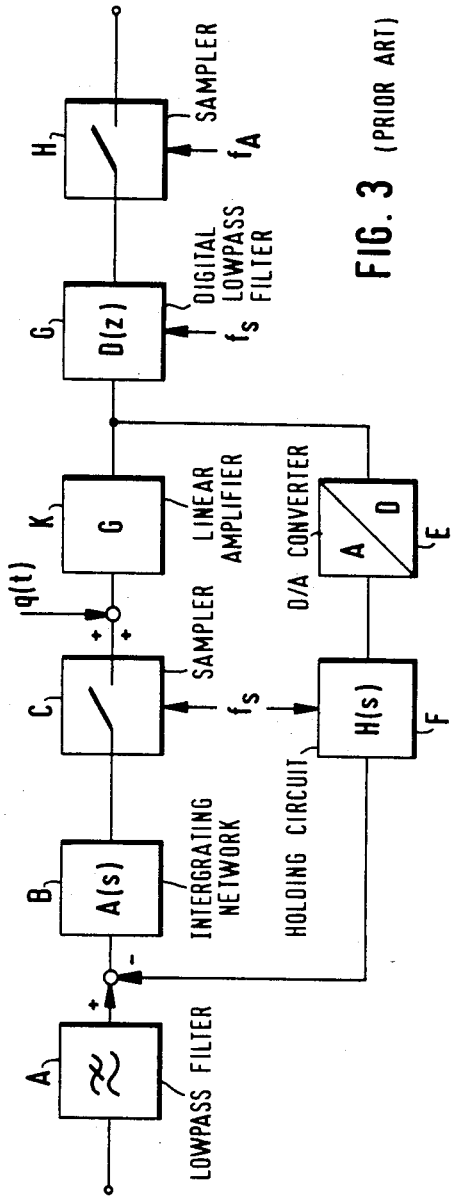

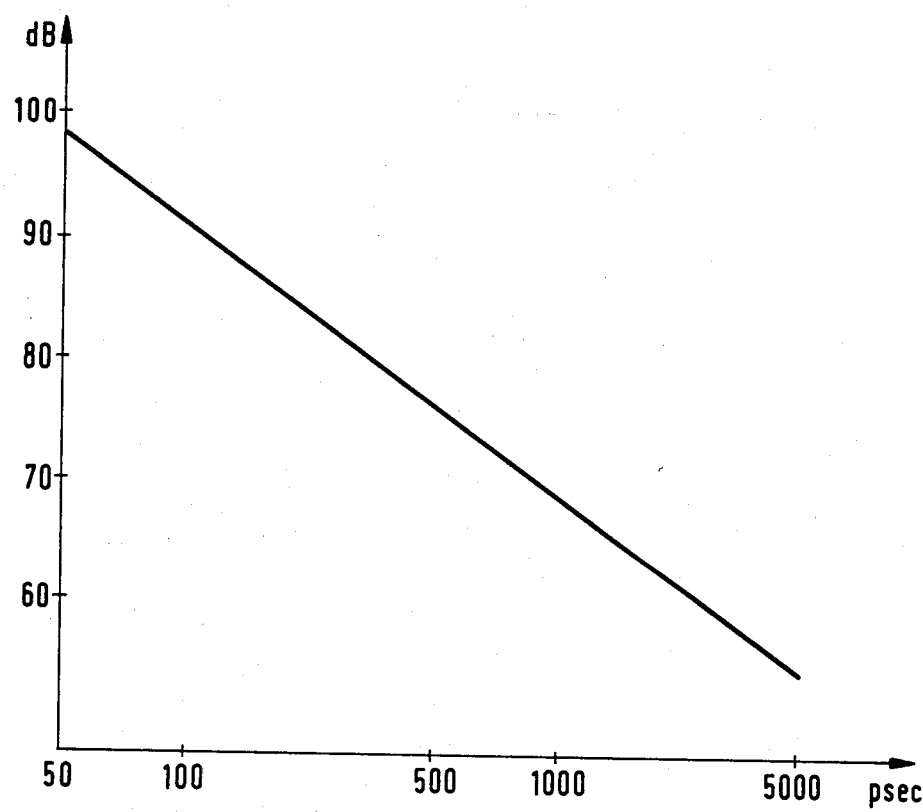
FIG. 6
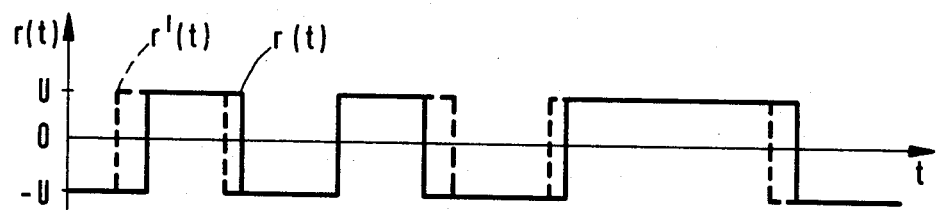
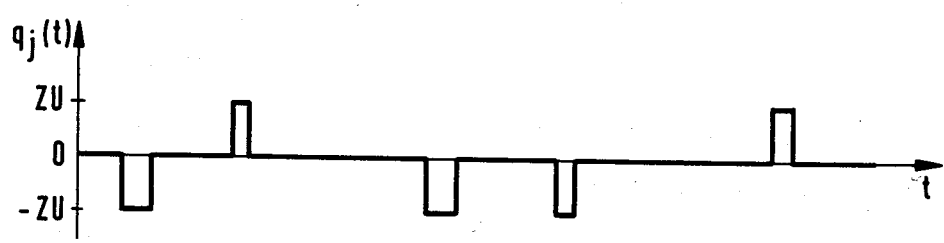
FIG. 7

METHOD AND ARRANGEMENT FOR INTERPOLATIVE A/D CONVERSION

BACKGROUND OF THE INVENTION

The present invention relates to a method for the interpolative conversion of analog signals to digital signals, wherein the analog input signal is sampled at a multiple of the Nyquist frequency and is quantized with an amplitude resolution corresponding to one bit. The quantized signal is returned to the input and subtracted from the analog input signal. The sampled signal and the quantized signal are converted to a PCM signal by passing through a digital lowpass filter and subsequent sampling at the Nyquist frequency.

A method of the above type is disclosed in J. C. Candy, "A Use of Limit Cycle Oscillations to Obtain Robust Analog-to-Digital Converters", IEEE Trans. Commun., Volume COM-22 (1974), pages 298-305. and in J. C. Candy, Y. C. Ching, D. S. Alexander, "Using Triangular Weighted Interpolation to Get 13-Bit PCM From a Sigma Delta Modulator", IEEE Trans. Commun., Volume COM-24 (1976), pages 1268-1275.

Analog to digital (A/D) converters having an amplitude resolution corresponding to 16 bits per sample value and a sampling rate of 48 kHz are used to digitalize high value audio signals. Conventional A/D converters attain such amplitude resolution by using high precision components. They are not suitable for the integration of a coder PCM for audio signals. Interpolative A/D converters achieve high amplitude resolution not by great precision of the components employed but by sampling at a multiple of the Nyquist frequency and subsequent digital interpolation of the roughly quantized sample values.

FIG. 1 shows the structure of a prior art interpolative A/D converter for audio signals. The analog input signal is initially limited in bandwidth in a lowpass filter A. The difference between the output signal x (t) of the lowpass filter and the feedback signal r (t) is integrated in an integrating network B, sampled at a clock frequency $f_s$ which is a multiple of the Nyquist frequency $f_A$ in sampler C and roughly quantized in an A/D converter D having low amplitude resolution. The output signal of the A/D converter is returned, via a D/A converter E and a holding circuit F, to the input of the integrating network. For the sake of simplicity, the power density spectrum $S'_q$ of the quantizing error $q'$ is initially assumed to correspond to white noise. As shown in FIG. 2, returning the quantized signal through the integrating network B reduces the error component in the low frequency range while it is increased at high frequencies. The spectral composition of the input signal is not changed by this feedback. In a digital lowpass filter G having a bandwidth fg, the high frequency component of the quantizing error $q'$ can now be removed from the signal, so that by subsequent subsampling via a sampler H, a signal can be generated at a lower sampling rate but with reduced quantizing error. Since the input signal is sampled at the Nyquist frequency only at the output of the interpolative A/D converter, the analog channel filter at the input can be omitted. The necessary bandwidth limitation to half the sampling frequency is effected by digital filter G. Since the digital filter and the analog portion of the converter do not require matching and do not contain precision components, the method of interpolative A/D conversion appears to be suitable for the production of a PCM coder for audio signals in the form of an integrated circuit.

A particularly favorable realization of the structure shown in FIG. 1 is obtained if the output signal $u'(n\tau)$ of the A/D converter D is quantized only with an amplitude resolution corresponding to one bit. The analog component of such a structure can be optimized and the conversion error can be calculated. The discussion below is based on such results.

To facilitate the description of the structure of FIG. 1, reference is made to FIG. 3 where a change is made in the block circuit diagram of FIG. 1 by replacing the 1-bit A/D converter D with a linear amplifier K and an adder for an error signal q (t). For the output signal $u'(n\tau)$ of the 1-bit A/D converter D, the following then applies in the spectral range:

$$U(j\omega) = \frac{A(j\omega) \cdot G}{1 + A(j\omega) \cdot G \cdot H(j\omega)} \cdot X(j\omega) + \frac{G}{1 + A(j\omega) \cdot G \cdot H(j\omega)} \cdot Q(j\omega), \quad (1)$$

Where Q (jω) represents system specific error;
X (jω) represents the analog input signal;
A (jω) represents the transfer function of the integrating network;
H (jω) represents the transfer function of the hold circuit By using $A(j\omega) \cdot G \gg 1$ and $H(j\omega) = 1$ for $\omega < 2\pi W$, the following applies:

$$U(j\omega) = X(j\omega) + \frac{G}{1 + A(j\omega) \cdot G \cdot H(j\omega)} \cdot Q(j\omega) \quad (2)$$

Equation (2) shows that the input signal x(t) is not changed in its spectral composition while the power density $S'_{qu}$ of the error signal contained in $u'(n\tau)$ results according to the function $$S'_{qu}(f) = \frac{G^2}{|1 + A(j2\pi f) \cdot G \cdot H(j2\pi f)|^2} \cdot S'_q(f) \quad (3)$$

With an ideal lowpass filter G having the limit frequency $f_g$ (for a lowpass filter the bandwidth and the limit frequency are equivalent), the remaining residual error $P_q$ of the interpolative A/D converter is calculated, under the above assumptions, at $$P_q = \int_{-f_g}^{f_g} \frac{1}{|A(j2f)|^2} \cdot S'_q(f) df, f_g = 20 \text{ kHz} \quad (4)$$

For the representative amplitude levels $+U$ and $-U$ of the one-bit A/D converter D, the interpolative A/D converter can be fully modulated with a sinusoidal oscillation of the maximum amplitude U. At the degree of modulation M ($0 \leq M \leq 1$) of the interpolative A/D converter, the power $P_x$ of a sinusoidal input signal will be $$P_x = M^2 \cdot \frac{U^2}{2} \quad (5)$$

The signal to noise ratio of the interpolative A/D converter is then calculated as follows:

$$\frac{P_x}{P_q} = \frac{M^2 \cdot U^2}{2 \cdot \int_{-f_g}^{f_g} \frac{1}{|A(j2f)|^2} \cdot S'_q(f) \cdot df} \quad (6)$$

By optimizing the transfer function of the integrating network B, the remaining conversion error can be minimized. The previously made assumption that the quantizing error of the one-bit quantizer has a white power density spectrum, can no longer be maintained if the conversion error is analyzed correctly. Rather, it is found that the spectral power density of the quantizing error is dependent on the degree of modulation of the interpolative converter and on the dimensions of the integrating network B and that with decreasing modulation, the conversion error is reduced. The conversion error can be calculated by means of a correction factor k(M) from the value that would result if a white power density spectrum were assumed. With the use of a simple integrator which has the characteristic $$A(j\omega) = \frac{1}{j\omega} \quad (7)$$

and under consideration of a nonwhite power density spectrum $S'_q$, there results a signal to noise ratio of $$\frac{P_x}{P_q} = M^2 \cdot \frac{9 \cdot N^3 \cdot \alpha^3}{2 \cdot \pi^2} \cdot \frac{1}{k_1(M)} \quad (8)$$

where $$\alpha = \frac{W}{f_g}$$

Here, $k_1$ (M) is the correction factor which is dependent upon the modulation M of the interpolative A/D converter and which is shown in FIG. 4. The signal to noise ratio can be improved if instead of a simple integrator a double integrating network is employed which has the characteristic $$A(j\omega) = \frac{(1 + j\omega\tau_3)}{(1 + j\omega\tau_1) \cdot (1 + j\omega\tau_2)} \quad (9)$$

where $\tau_1$, $\tau_2$ and $\tau_3$ are the time constants of the network, that is shown in FIG. 10. The signal to noise ratio is then calculated as follows:

$$\frac{P_x}{P_q} = \frac{6 \cdot N^3 \cdot \alpha^3 \cdot \beta^2 \cdot \gamma^2}{\psi^2 \cdot \left[\left(1 + \frac{4\pi^2}{3} \cdot \beta^2(1 + \gamma^2) + \frac{16}{5} \cdot \pi^4 \cdot \beta^4 \cdot \gamma^2\right)\right]} \cdot M^2 \cdot \frac{1}{k_2(M)} \quad (10)$$

where $$\alpha = \frac{W}{f_g}, \beta = \tau_1 \cdot f_g, \gamma = \frac{\tau_2}{\tau_1}, \psi = \frac{\tau_3}{\tau_1}$$

In order to attain the desired amplitude resolution corresponding to 16 bits in the interpolative A/D converter, Equation (10) indicates that an internal clock pulse frequency $F_s$ of 12 MHz, corresponding to a factor N=256, is necessary for the interpolation loop. Measurement tests made with a laboratory model did not bring the expected results. At a sampling frequency of 48 kHz, the signal to noise ratio realized was only 70 dB. This conversion error which was higher than the calculated value can be traced back only to the nonideal characteristic of the components employed. The influence of the characteristics of real components on the conversion will be examined below.

In the previous considerations regarding the interpolative A/D conversion, it was assumed, according to FIG. 1, that the train of sampled signals u'(nτ) is converted by D/A converter E and holding circuit F in the feedback branch into an exactly meander-shaped signal r(t). Such a signal cannot be realized by way of circuitry. The deviations of the actual signal curve r(t) from the ideal meander shape, as indicated in FIG. 5a, can be traced back to linear and nonlinear distortions in holding circuit F.

The linear distortions caused by holding circuit F can be interpreted essentially as deviations from the optimized transmission behavior of the integrating network B. They can be compensated by appropriate correction of integrating network B.

The nonlinear distortions may be due to the following:

(a) asymmetries in the switching behavior of the holding circuit with the result that the integral over two successive pulses at the same polarity is different from the integral of two individual pulses;

(b) time changes in the length of the loop clock pulse period τ (clock jitter) produce an amplitude error in the converted PCM signal; or (c) inherent noise in the analog components employed reduces the signal to noise ratio of the converter.

Measurements have shown that it is certain that inherent noise is negligible and that only the first two causes require investigation.

The nonlinear distortions caused by asymmetries in the switching behavior of the holding circuit result in a reduction of the intermodulation ratio of the holding circuit. In addition to processing the signal power, the holding circuit must also process high frequency quantizing error components whose power, even under full modulation, is greater than the signal power. An additional error component in the signal frequency range 0<f<W is therefore produced as the intermodulation product of the high frequency quantizing error contained in u'(n τ). To examine the influence of these asymmetries and check out optimization attempts, the method of interpolative A/D conversion was simulated in a digital computer. In this simulation, a sinusoidal input signal was assumed to exist and the signal to noise ratio of the converter was monitored in dependence on the switching behavior. The switching behavior was initially determined by different rise and fall times for the signal r(t) of FIG. 1. FIG. 6 shows the influence of the difference δ between rise time and fall time of the signal r(t) on the signal to noise ratio of the converter. As shown in FIG. 6, in order to attain the required signal to noise ratio of 98 dB, the difference between rise time and fall time of r(t) must not exceed a value of 50 ps.

Time changes in the loop clock pulse period τ, that may occur due to thermal noise in the active components for clock pulse processing or in the holding circuit, result in an additional error in the interpolative analog to digital conversion. To be able to quantitatively determine this additonal conversion error, the signal r(t) can be resolved, according to FIG. 7, into an exact meander-shaped signal r'(t) and a pulse-shaped error signal $q_j(t)$, where $$r(t) = r'(t) + q_j(t) \tag{11}$$

Equation (2) then changes to $$U(j\omega) = X(j\omega) + \frac{A(j\omega) \cdot G}{1 + A(j\omega) \cdot G \cdot H(j\omega)} \cdot Q_j(j\omega) + \tag{12}$$

$$\frac{G}{1 + A(j\omega) \cdot G \cdot H(j\omega)} \cdot Q(j\omega)$$

where $Q(j\omega)$ represents the system specific error and $Q_j(j\omega)$ the realization specific error.

Let it be assumed that $\lambda$ is a random variable which may take on the value +1 or −1. If it is assumed that the clock pulse period has a Gauss distribution with an average value $\tau$ and a standard deviation $\sigma$, then $q_j(t)$ can be approximated by a series of Dirac pulses of the integral $2 U \cdot \sigma$ as follows:

$$q_j(t) = 2 \cdot U \cdot \sigma \sum_{\lambda = -\infty}^{\infty} a_\lambda \cdot \delta(t - \lambda \tau) \tag{13}$$

According to the Fourier transformation of (13), the power density spectrum $S_{qj}(f)$ of the error signal is $$S_{qj}(f) = \frac{4 \cdot U^2 \cdot \sigma^2}{\tau} \tag{14}$$

and the error power $P_{qj}$ in the base band is:

$$P_{qj} = \int_{-f_g}^{f_g} \frac{4 \cdot U^2 \cdot \sigma^2}{\tau} df = 8 \cdot U^2 \cdot \sigma^2 \cdot \frac{f_g}{\tau} ; f_g = 20 \text{ kHz} \tag{15}$$

In order for the additional conversion error caused by the time changes in the clock pulse period $\tau$ to become negligible, the following condition must be met:

$$\frac{P_x}{P_{qj}} = \frac{M^2}{16 \cdot \sigma^2} \cdot \frac{\tau}{f_g} >> \frac{P_x}{P_q} \tag{16}$$

For the standard deviation of the clock pulse period $\tau$ there results a maximum value $$\sigma << \frac{M}{4} \cdot \sqrt{\frac{P_q}{P_x} \cdot \frac{\tau}{f_g}} ; \tau = \frac{1}{2NW} \tag{17}$$

which, for the desired signal to noise ratio of 98 dB, must not exceed a value of 6.2 ps.

This theoretically determined value was confirmed by the above described simulation of the interpolative A/D conversion in a digital computer. The switching behavior was here determined by representing the loop clock pulse period $\tau$ as a random variable having a probability density according to Gauss.

Representation of signal r(t) by meander-shaped pulses having such slight jitter cannot be realized with justifiable expenditures. The method of interpolative A/D conversion was therefore modified with a view toward reducing the errors caused by the realization.

It was thus determined that the accuracy requirements as they exist in today's audio studio techniques with respect to signal to noise ratio cannot be realized with the circuit structure according to the prior art.

SUMMARY OF THE INVENTION

It is therefore an object of the present invention to improve the prior art method of interpolative conversion of analog signals to digital signals so that the above-stated requirements are met.

The above and other objects are accomplished according to the invention wherein a method is provided for the interpolative conversion of an analog input signal to a digital output signal including: forming an intermediate signal from the input signal; integrating the intermediate signal; sampling the integrated intermediate signal at a sampling frequency which is a multiple of the Nyquist frequency to form a sampled signal; quantizing the sampled signal with an amplitude resolution corresponding to one bit to form a quantized signal; forming a feedback signal from the quantized signal, the feedback signal comprising pulses the peak amplitude of which can be one of two representative values and which return to a mean value of the representative values within a time interval equal to one period of the sampling frequency; combining the feedback signal with the input signal to form the intermediate signal; passing the quantized signal through a digital lowpass filter; and sampling the output of the digital lowpass filter to produce a PCM signal, the PCM signal constituting the digital output signal.

BRIEF DESCRIPTION OF THE DRAWINGS

FIG. 1 is a block circuit diagram of an interpolative A/D converter according to the prior art.

FIG. 3 is a block circuit diagram slightly modified from that of FIG. 1 for the purpose of facilitating the description of the prior art interpolative A/D converter of FIG. 1.

FIG. 6 is a graph of showing signal to noise ratio versus the difference between rise time and fall time of the feedback signal r(t).

FIGS. 7a and 7b are graphs of the feedback signal resolved into an exact meander-shaped signal r'(t) and a pulse-shaped error signal $q_j(t)$, respectively.

DESCRIPTION OF THE PREFERRED EMBODIMENT

Figure 2:
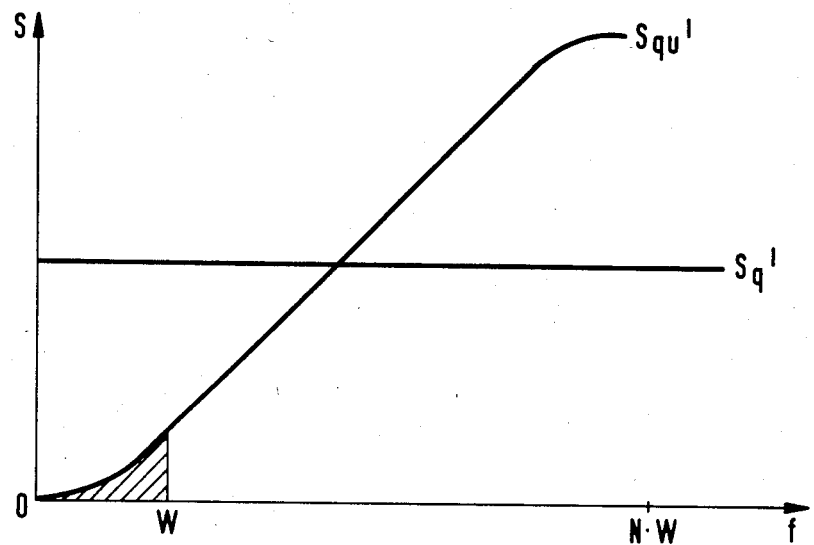
FIG. 2 is a graph showing the power density of an error signal produced by the interpolative A/D converter of FIG. 1.
Figure 4:
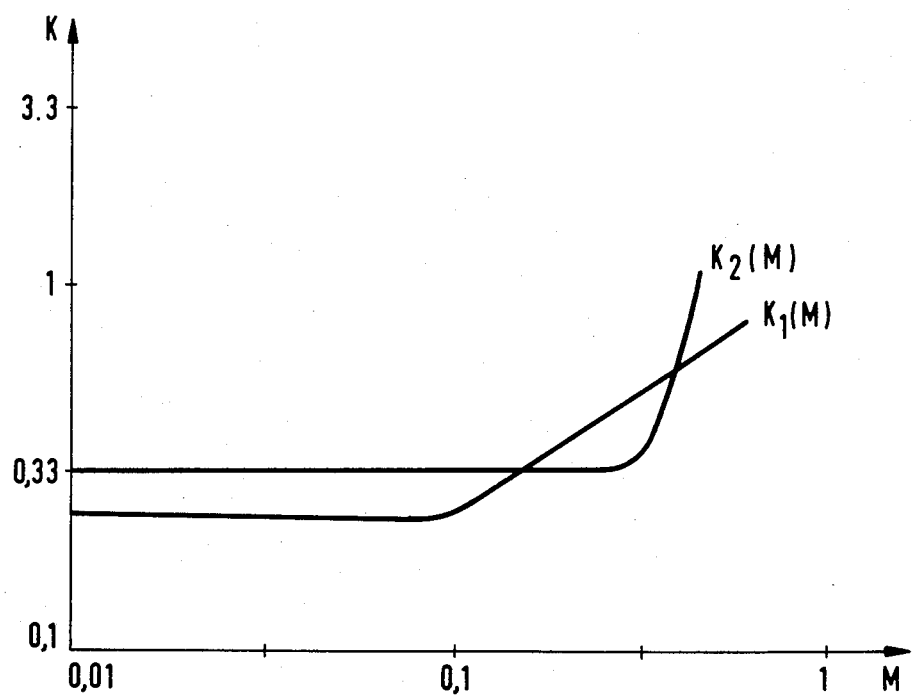
FIG. 4 is a graph of correction factors K versus degree of modulation M which are associated with the interpolative A/D converter of FIG. 1.
Figure 5:
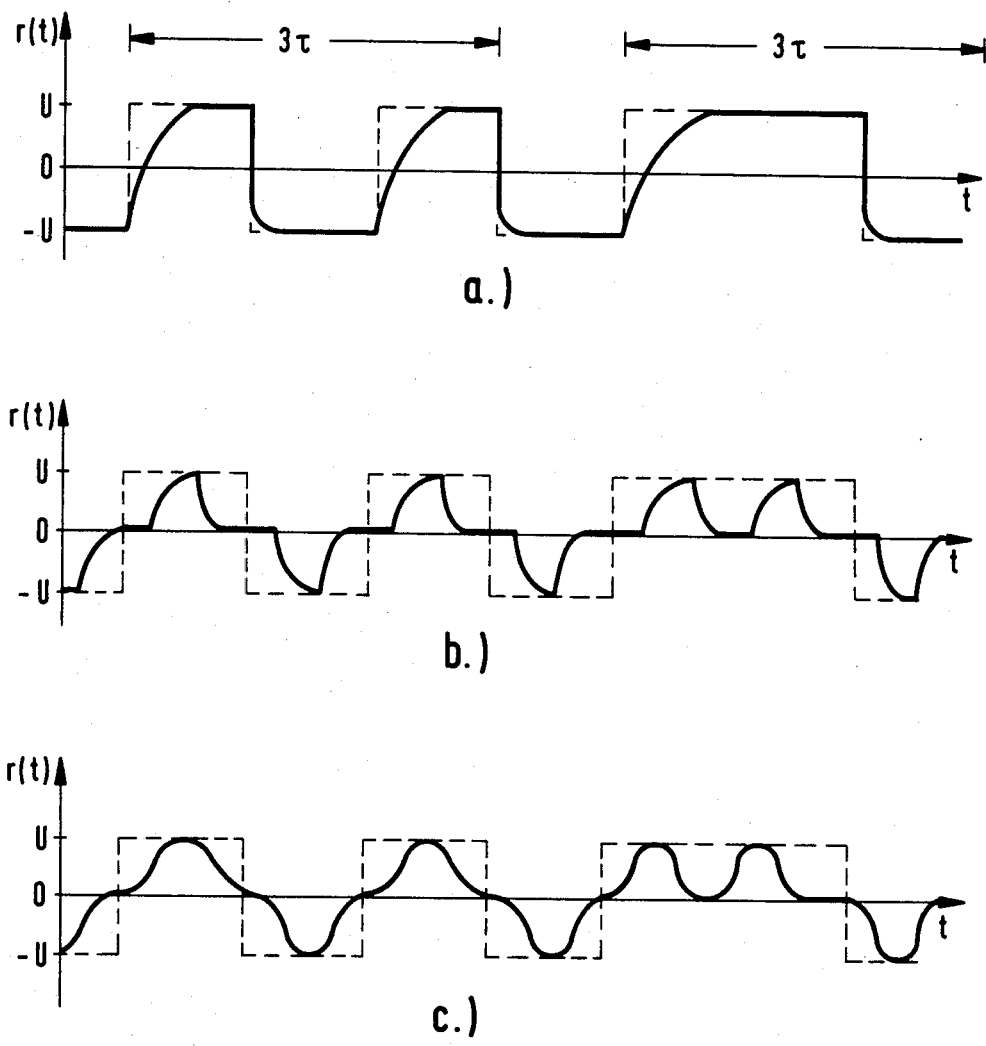
FIGS. 5a, 5b and 5c are graphs of the feedback signal r(t).

To improve the signal to noise ratio of an interpolative A/D converter for audio signals, at least one of the following steps according to the present invention must be taken:

(a) To avoid distortions caused by asymmetries in the switching behavior of the holding circuit, pulse shapes must be employed to represent the analog feedback signal r(t) which returns, according to FIG. 5b, to a mean value of 0 between two representative amplitude values +U and −U within one clock pulse period of the feedback loop.

(b) To limit the conversion error caused by clock pulse jitter, the analog signal r(t) must be represented by pulse shapes which can be generated with great time precision.

(c) To be able to realize sufficient decoupling of the individual stages of the analog portion of the interpolative converter, very high frequency components in signal r(t) must be avoided by the use of pulse shapes having only low slope steepness.

FIG. 5c shows how signal r(t) is composed of individual sinusoidal pulses which can be generated with greater spectral purity according to the present invention.

Figure 8:
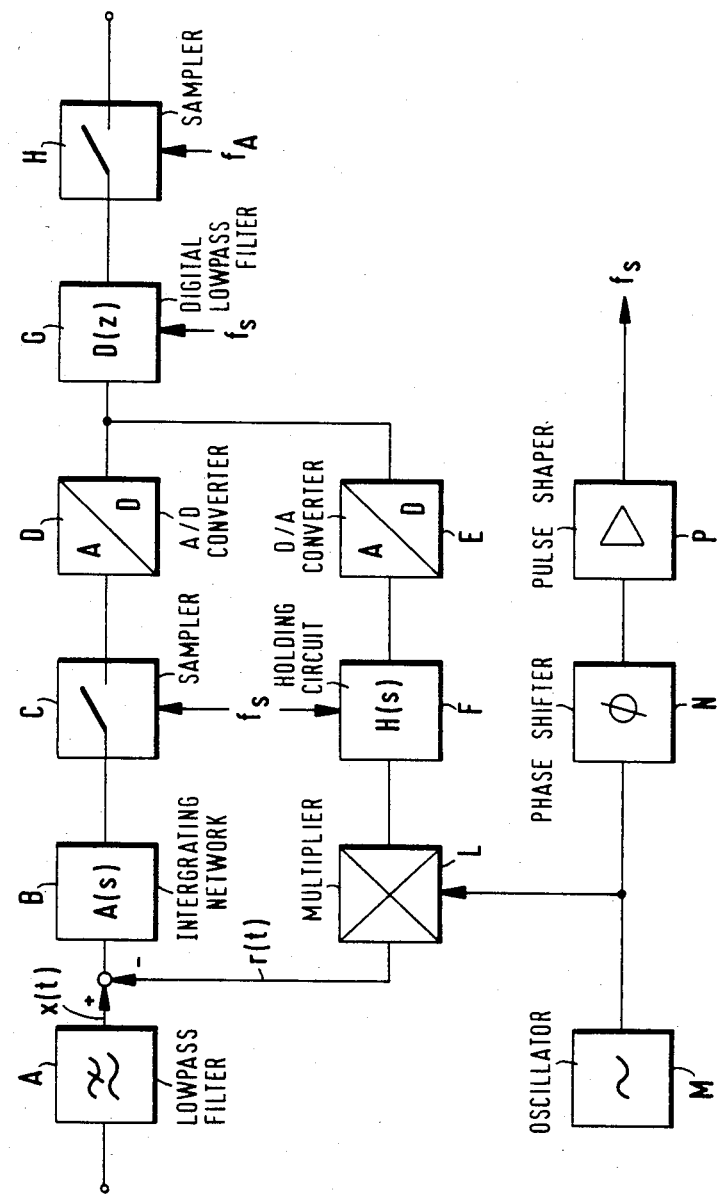
FIG. 8 is a block circuit diagram of an interpolative A/D converter according to the invention.

FIG. 8 shows the arrangement of an interpolative A/D converter which serves to implement the method according to the present invention. This arrangement was derived from the arrangement of FIG. 1 for use with sinusoidal pulses to represent signal r(t).

Figure 9:
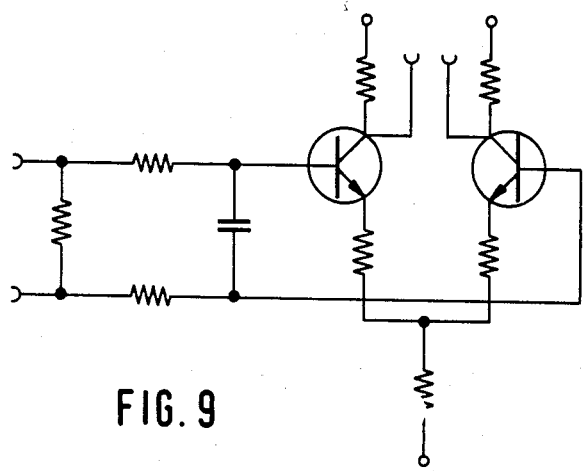
FIG. 9 is a circuit schematic of an analog lowpass filter which can be used in the circuit of FIG. 8.
Figure 10:
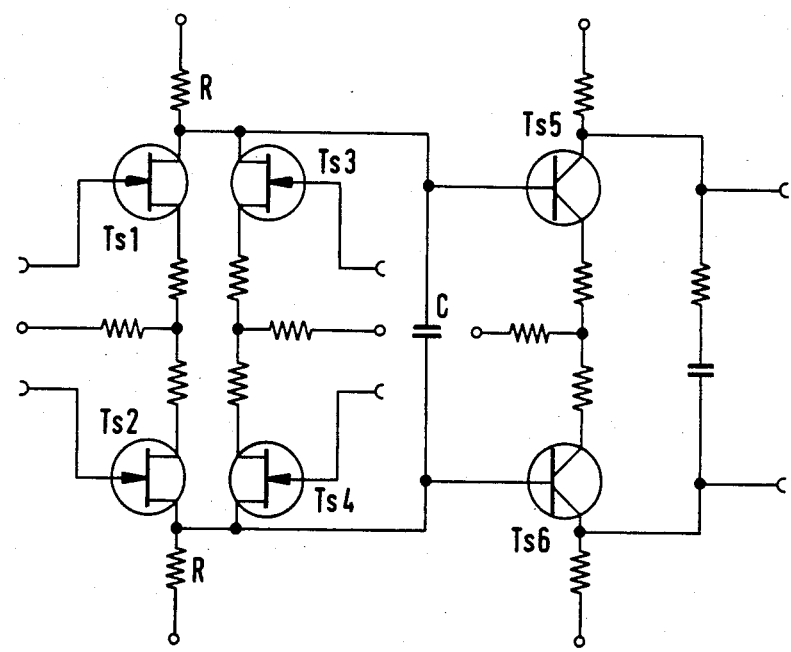
FIG. 10 is a circuit schematic of a difference and integrating network which can be used in the circuit of FIG. 8.

The procedure of the method according to the present invention will be described with the example of a circuit that was reduced to practice as shown in FIG. 8. The analog input signal is initially limited in bandwidth in a lowpass filter A. An embodiment of such a lowpass filter is shown in FIG. 9 and is described in the book by U. Tietze, Ch. Schenk, entitled "Halbleiterschaltungstechnik" [Semiconductor Circuit Technology], 5th Edition, Berlin, Heidelberg, New York, 1980, pages 59 et seq. The difference between the output signal x(t) of lowpass filter A and the returned signal r(t) is integrated in integrating network B. This difference formation and the integration are effected in a network as shown in FIG. 10. Transistors Ts1 and Ts2 or Ts3 and Ts4, respectively, in one specific embodiment of the circuit, are dual transistors, type U431, made by Siliconix Inc. of Santa Clara, Calif., USA. They are part of the difference forming circuit while transistors Ts5 and Ts6, both type MD7003 made by Motorola, represent a separating amplifier for integrating network B.

After integration in network B, the signal is sampled in sampler C at a multiple of the Nyquist frequency $f_A$ and is roughly quantized in A/D converter D having low amplitude resolution. Such sampling and A/D conversion may be accomplished with the aid of an integrated circuit known as SP9685 made by Plessey, Inc., Melville, N.Y., USA.

The output signal of A/D converter D is conducted via D/A converter E and holding circuit F, the two of which may be realized by an integrated circuit known as SP 1670 made by Plessey Inc., Melville, N.Y., USA.

Figure 11:
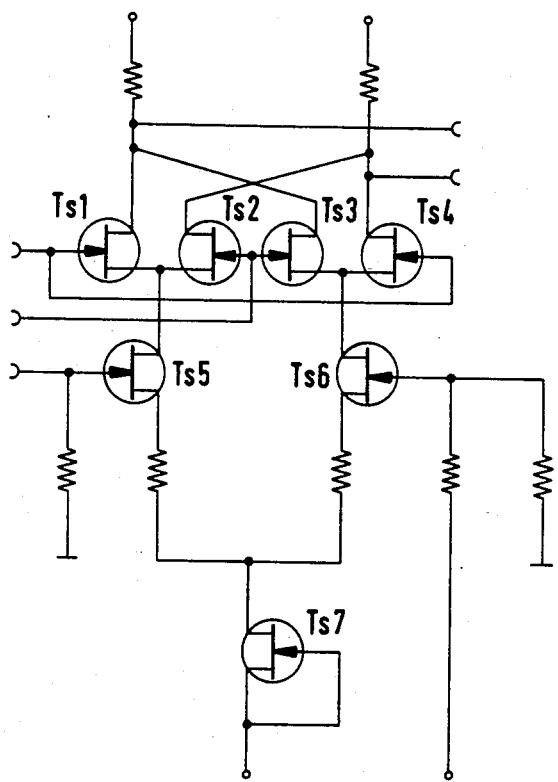
FIG. 11 is a circuit schematic of a multiplier which can be used in the circuit of FIG. 8.

From holding circuit F, the signal is transmitted to multiplier circuit L which is designed as shown in FIG. 11, where transistors Ts1 to Ts4 are comprised of a quadruple transistor U350, transistors Ts5 and Ts6 are comprised of a dual transistor U431 and transistor Ts7 (constant current source) is comprised of a single transistor U310. All of these transistors are produced by Siliconix Inc., Santa Clara, Calif., USA. The multiplier of FIG. 11 is capable of multiplying the input voltage by factors of 1 or −1 respectively. The factor is controlled by the output voltage of the holding circuit F. Transistors Ts5 to Ts7 represent a differential amplifier. The difference between the drain currents of Ts6 and Ts5 is proportional to the input voltage of the multiplier. Transistors Ts1 and Ts4 represent a set of 4 switches that is capable of exchanging the drain currents of Ts6 and Ts5, depending on the output voltage of the holding circuit F. The output voltage of the multiplier is proportional to the difference of the drain currents. Therefore exchanging the drain currents is equivalent to multiplying by a factor of −1.

Figure 12:
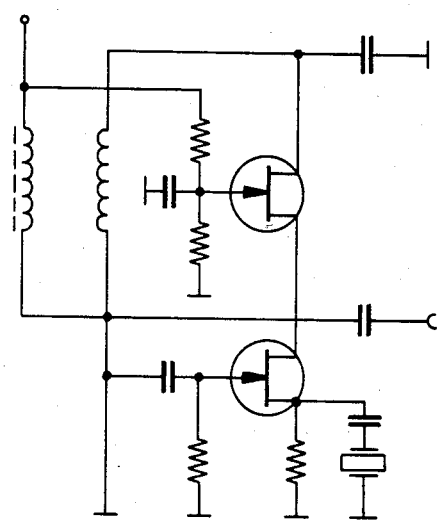
FIG. 12 is a circuit schematic of a quartz oscillator which can be used in the circuit of FIG. 8.

Quartz oscillator M is designed as shown in FIG. 12. This oscillator is described in the periodical UKW -Berichte [VHF Reports], No. 2, 1981, page 92. Thus, in multiplier circuit L, output signal of holding circuit F controls the polarity of sinusoidal pulses which are derived from quartz oscillator M. The output signal of the quartz oscillator is additionally used to obtain, via a phase shifter N and a pulse shaper P, the stated multiple $f_s$ of the Nyquist frequency.

Figure 13:
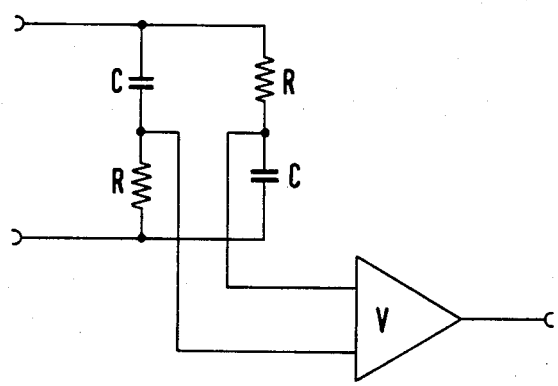
FIG. 13 is a circuit schematic of a phase shifter and pulse shaper which can be used in the circuit of FIG. 8.

The circuitry for N and P is shown in FIG. 13. The RC network serves in a known manner to produce a phase shift of 90° while circuit V, an integrated circuit known as SP9685 made by Plessey, Inc., Melville, N.Y., USA, serves to shape the pulses.

Figure 14:
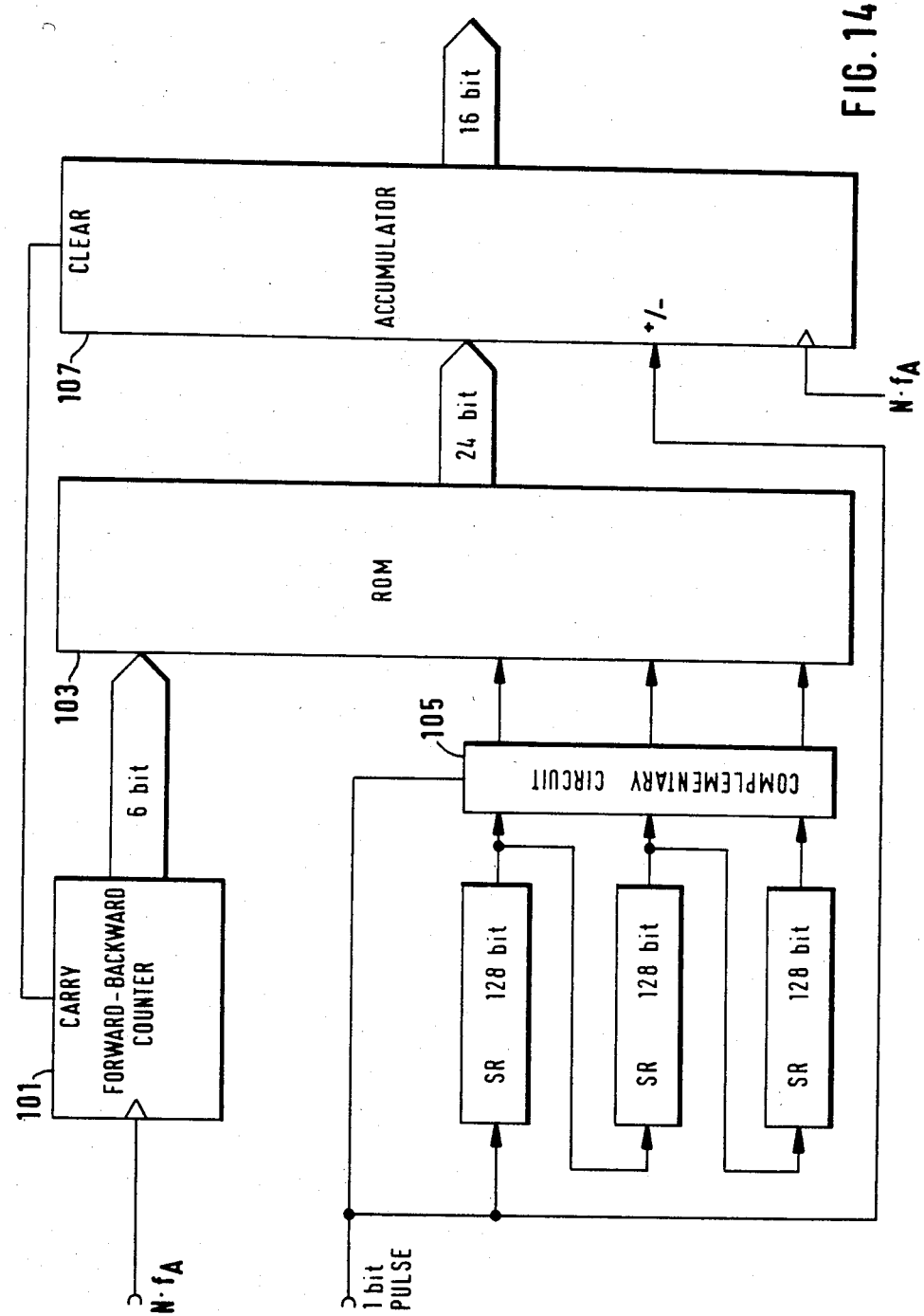
FIG. 14 is a block circuit diagram of a digital lowpass filter and sampler which can be used in the circuit of FIG. 8.

The output signal of the entire circuit is processed in digital lowpass filter G and sampler H. A combined circuit which has been reduced to practice for digitial lowpass filter G and sampler H is shown in FIG. 14.

By a forward-backward counter 101, frequency $f_s = N \cdot f_A$ is fed to a ROM 103 (read-only memory), whose inputs receive the output signal of A/D converter D from three shift registers SR (128 bits) and a complementary circuit 105. The output signal of the ROM 103 is processed further in the accumulator 107. In the circuit that has been reduced to practice, the shift registers SR employed were integrated circuits, type TDC1005, made by TRW Semiconductors, Inc., Lawndale, Calif., USA. The ROM 103 was composed of three circuits of type 7641 made by Harris Corp., Cleveland, Ohio, USA, and the accumulator 107 was comprised of eight of the integrated circuits of type SN74 S281 made by Texas Instruments Inc., Dallas, Tex., USA. A detailed description of the operation of this digital filter G as well as the calculation of the informational content of ROM 103 is included in Kammeyer, K. D., Analyse des Quantisierungsfehlers bei der verteilten Arithmetik. Ausgew. Arbeiten über Nachrichtensysteme, published by W. Schüssler, University of Erlangen-Nürnberg, Nr. 29 (1977).

An interpolative A/D converter operating according to the present invention attained a signal to noise ratio of more than 85 dB (corresponding to 14 bits) at a sampling rate of 50 kHz. Compared to the prior art, this is an improvement in the signal to noise ratio of more than 15 dB.

It will be understood that the above description of the present invention is susceptable to various modifications, changes and adaptations, and the same are intended to be comprehended within the meaning and range of equivalence of the appended claims.

What is claimed is:

1. Method for the interpolative conversiom of an analog input signal to a digital output signal comprising:
   forming an intermediate signal from the input signal;
   integrating the intermediate signal;
   sampling the integrated intermediate signal at a sampling frequency which is a multiple of the Nyquist frequency to form a sampled signal;
   quantizing the sampled signal with an amplitude resolution corresponding to one bit to form a quantized signal;
   forming a feedback signal from the quantized signal, the feedback signal comprising pulses each of which returns to a zero within a time interval equal to one period of the sampling frequency;
   combining the feedback signal with the input signal to form the intermediate signal;
   passing the quantized signal through a digital lowpass filter; and
   sampling the output of the digital lowpass filter to produce a PCM signal, the PCM signal constituting the digital output signal.

2. The method of claim 1, wherein said combining step includes subtracting the feedback signal from the analog input signal to form a difference signal which constitutes the intermediate signal.

3. The method of claim 1, wherein said combining step includes adding the feedback signal and the analog input signal to form a sum signal which constitutes the intermediate signal.

4. Method as defined in claim 1 wherein the pulses of the feedback signal are sinusoidal.

5. Method as defined in claim 1 wherein the pulses of the feedback signal are trapezoidal.

6. Method as defined in claim 1 wherein the pulses of the feedback signal are triangular.

7. Method as defined in claim 1 wherein the pulses of the feedback signal are rectangular, representing a return to zero code.

* * * * *